(12) United States Patent
Nam

(10) Patent No.: US 8,388,757 B2
(45) Date of Patent: Mar. 5, 2013

(54) ELECTROSTATIC CHUCK AND APPARATUS FOR TREATING SUBSTRATE INCLUDING THE SAME

(75) Inventor: Chang Kil Nam, Gyeonggi-do (KR)

(73) Assignee: Jusung Engineering Co., Ltd., Gwangju-si, Gyeonggi-do (KR)

( * ) Notice: Subject to any disclaimer, the term of this patent is extended or adjusted under 35 U.S.C. 154(b) by 813 days.

(21) Appl. No.: 12/257,480

(22) Filed: Oct. 24, 2008

(65) Prior Publication Data

US 2009/0165956 A1 Jul. 2, 2009

(30) Foreign Application Priority Data

Dec. 27, 2007 (KR) ........................ 10-2007-0139256

(51) Int. Cl.
*C23C 14/50* (2006.01)
(52) U.S. Cl. ........................................................ 118/728
(58) Field of Classification Search .................. 118/728
See application file for complete search history.

(56) References Cited

U.S. PATENT DOCUMENTS

| 6,538,872 B1 * | 3/2003 | Wang et al. .................... 361/234 |
| 2002/0075624 A1 | 6/2002 | Wang et al. |
| 2006/0076109 A1 * | 4/2006 | Holland et al. ............... 118/728 |

FOREIGN PATENT DOCUMENTS

| CN | 101090259 | | 12/2007 |
| CN | 101095212 A | | 12/2007 |

* cited by examiner

*Primary Examiner* — Dah-Wei Yuan
*Assistant Examiner* — Stephen Kitt
(74) *Attorney, Agent, or Firm* — Renaissance IP Law Group LLP

(57) ABSTRACT

An electrostatic chuck for an apparatus for treating a substrate includes a body; an insulating plate attached onto a top surface of the body, wherein the substrate is disposed on the insulating plate; an electrode in the insulating plate; a temperature controlling unit including a heating unit and a cooling unit under the electrode and in the insulating plate; and a thermal conduction unit disposed between the electrode and the temperature controlling unit.

16 Claims, 4 Drawing Sheets

ELECTROSTATIC CHUCK AND APPARATUS FOR TREATING SUBSTRATE INCLUDING THE SAME

The present invention claims the benefit of Korean Patent Applications No. 10-2007-0139256 filed in Korea on Dec. 27, 2007, which is hereby incorporated by references.

BACKGROUND OF THE INVENTION

1. Field of the Invention

The present invention relates to an apparatus for treating a substrate, and more particularly, to an electrostatic chuck and an apparatus for treating a substrate including the electrostatic chuck.

2. Discussion of the Related Art

In general, the fabricating process for a semiconductor device or a flat panel display device includes various steps. For example, there are a thin film deposition step for depositing a thin film on a substrate, an etching step for forming a photosensitive material pattern exposing or covering a desired portion of the thin film and etching the thin film using the photosensitive material pattern to form a desired thin pattern, an ion injection step for injecting ions into the desired portion and on the substrate, a cleaning step for removing impurities from the substrate and a detecting step for detecting defects of the thin pattern on the substrate. A wafer is used as the substrate for the semiconductor device. The above steps are processed in a chamber under an optimum condition.

In the fabricating process for the semiconductor device, an apparatus for treating the substrate, where a reaction gas, which is exited into a plasma state, is used for forming or etching a thin film on the substrate, is widely used. The apparatus for treating the substrate includes a chamber having a reaction space, a plasma electrode forming a plasma using a reaction gas, an electrostatic chuck supporting a substrate, and so on. The electrostatic chuck fixes the substrate thereon using an electrostatic power and heats the substrate to a processing temperature using a heater therein.

FIG. 1 is a schematic cross-sectional view of an apparatus for treating a substrate including an electrostatic chuck according to the related art, and FIG. 2 is a cross-sectional view of an electrostatic chuck according to the related art. FIG. 3 is a plan view of a heater in an electrostatic chuck according to the related art.

In FIGS. 1 and 2, the apparatus 10 includes a chamber 12 having a reaction chamber, an electrostatic chuck 16 disposed in the chamber 12, a gas distribution plate 18 over the electrostatic chuck 16, a gas providing pipe 20 providing a reaction gas into the gas distribution plate 18 and an exhaust pipe 22 through which the reaction gas and particles in the chamber 12 are exhausted. The reaction space of the chamber 12 is airtight from an outside. A substrate 14 is disposed on the electrostatic chuck 16. The reaction gas is sprayed from the gas distribution plate 18 onto the substrate 14 on the electrostatic chuck 16.

The electrostatic chuck 16 includes a body 24 of an aluminum-based material, an insulating plate 26 combined with and disposed on the body 24, a direct current electrode 28 and a heater 30 under the direct current electrode 28. The direct current electrode 28 and the heater 30 are disposed in the insulating plate 26. The insulating plate 26 is formed of a ceramic-based material. The body 24 includes a center portion 24a and an edge portion 24b having a thickness smaller than the center portion 24a such that the body 24 has a step difference. The edge portion 24b of the body 24 is combined with a focus ring 34. The focus ring 34 is formed of a ceramic-based material. A plasma region is expanded into an outer region of the substrate 14 due to the pocus ring 34 such that uniform plasma is deposited onto the substrate 14. The heater 30 includes an outer heater 42 and an inner heater 44.

The substrate 14 is disposed on the insulating plate 26 of the electrostatic chuck 16. The direct current electrode 28 of a tungsten-base material is connected to a direct current source 36 such that an electrostatic power is generated. The substrate 14 is stably fixed on the electrostatic chuck 16 by the electrostatic power. A radio frequency (RF) power source 38 is connected to the body 24 of the electrostatic chuck 16, and the chamber 12 is connected to a ground. As a result, the body 24 of the electrostatic chuck 16 is electrically insulated from the chamber 12. A matcher 40 matching impedances for providing a maximum power is disposed between the RF power source 38 and the body 24 of the electrostatic chuck 16.

Referring to FIG. 3, the heater 30 having a coil shape is disposed in the electrostatic chuck 16. The inner heater 44 is disposed inside of the outer heater 42. When a thin film is deposited onto the substrate 14 or a thin film on the substrate 14 is etched, the substrate 14 is heated into a process temperature by the heater 30.

The apparatus 10 including the above-mentioned electrostatic chuck 16 is driven as followings. First, the substrate 14 is transported into the chamber 12 through a door (not shown) and disposed onto the insulating plate 26 of the electrostatic chuck 16. Then, the substrate 14 is stably fixed onto the insulating plate 26 by an electrostatic power generated by the direct current electrode 28. Gases in the reaction space of the chamber 12 are exhausted such that the reaction space of the chamber 12 has a vacuum state. A reaction gas is sprayed over the substrate 14 through the gas distribution plate 18, and an RF power is applied into the electrostatic chuck 16 by the RF power source 40 at the same time. An RF electric field is generated between the electrostatic chuck 16 and the chamber 12 by the RF power applied into the electrostatic chuck 16. An accelerated electron by the RF electric field is collided with a neutral gas such that a plasma including an ion and a radical is generated. As a result, a thin film is deposited onto the substrate 14 or a thin film on the substrate 14 is etched.

As mentioned above, the substrate 14 is heated into a process temperature by the heater 30 in the body 24 of the electrostatic chuck 16. The outer and inner heaters 42 and 44 are independently driven such that a temperature in the center portion of the electrostatic chuck 16 and a temperature in the edge portion of the electrostatic chuck 16 can be independently controlled. However, since the heater 30 is closet to a top surface of the insulating plate 26 and the ceramic material of the insulating plate 26 has a relatively low thermal conductivity, it is difficult to uniformly control a temperature on the top surface of the insulating plate 26. Accordingly, the electrostatic chuck 16 has a temperature deviation at a top surface of the electrostatic chuck 16. In addition, the temperature deviation is caused by a coil pattern of the heater 30. Since the temperature deviation causes a bad effect on a deposition process of a thin film onto the substrate 14 or an etching process of a thin film on the substrate 14, the products has a deteriorated quality because of the temperature deviation.

SUMMARY OF THE INVENTION

Accordingly, the present invention is directed to an electrostatic chuck and an apparatus for treating a substrate including the same that substantially obviates one or more of the problems due to limitations and disadvantages of the related art.

An object of the present invention is to provide an electrostatic chuck being capable of uniformly heating a substrate and an apparatus for treating a substrate including the same.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an electrostatic chuck for an apparatus for treating a substrate includes a body; an insulating plate attached onto a top surface of the body, wherein the substrate is disposed on the insulating plate; an electrode in the insulating plate; a temperature controlling unit including a heating unit and a cooling unit under the electrode and in the insulating plate; and a thermal conduction unit disposed between the electrode and the temperature controlling unit.

In another aspect, an apparatus for treating a substrate includes a chamber having a reaction space; an electrostatic chuck, on which the substrate is disposed, positioned in the ration space, the electrostatic chuck including a body; an insulating plate attached onto a top surface of the body, wherein the substrate is disposed on the insulating plate; an electrode in the insulating plate; a temperature controlling unit including a heating unit and a cooling unit under the electrode and in the insulating plate; and a thermal conduction unit disposed between the electrode and the temperature controlling unit; and a gas distribution plate over the electrostatic chuck.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments, examples of which are illustrated in the accompanying drawings.

Figure 1:
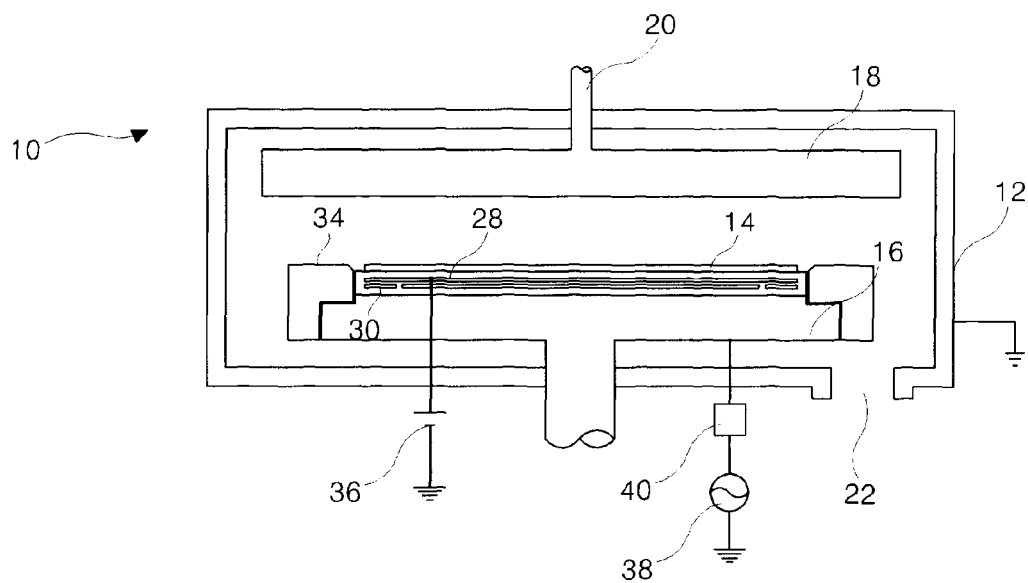
FIG. 1 is a schematic cross-sectional view of an apparatus for treating a substrate including an electrostatic chuck according to the related art.
Figure 2:
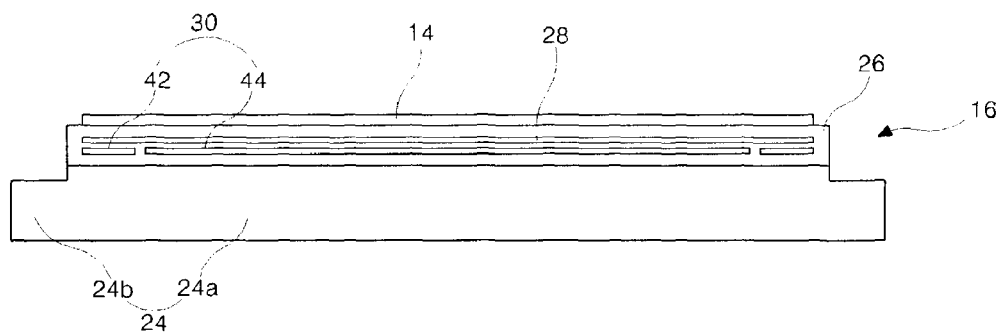
FIG. 2 is a cross-sectional view of an electrostatic chuck according to the related art.
Figure 3:
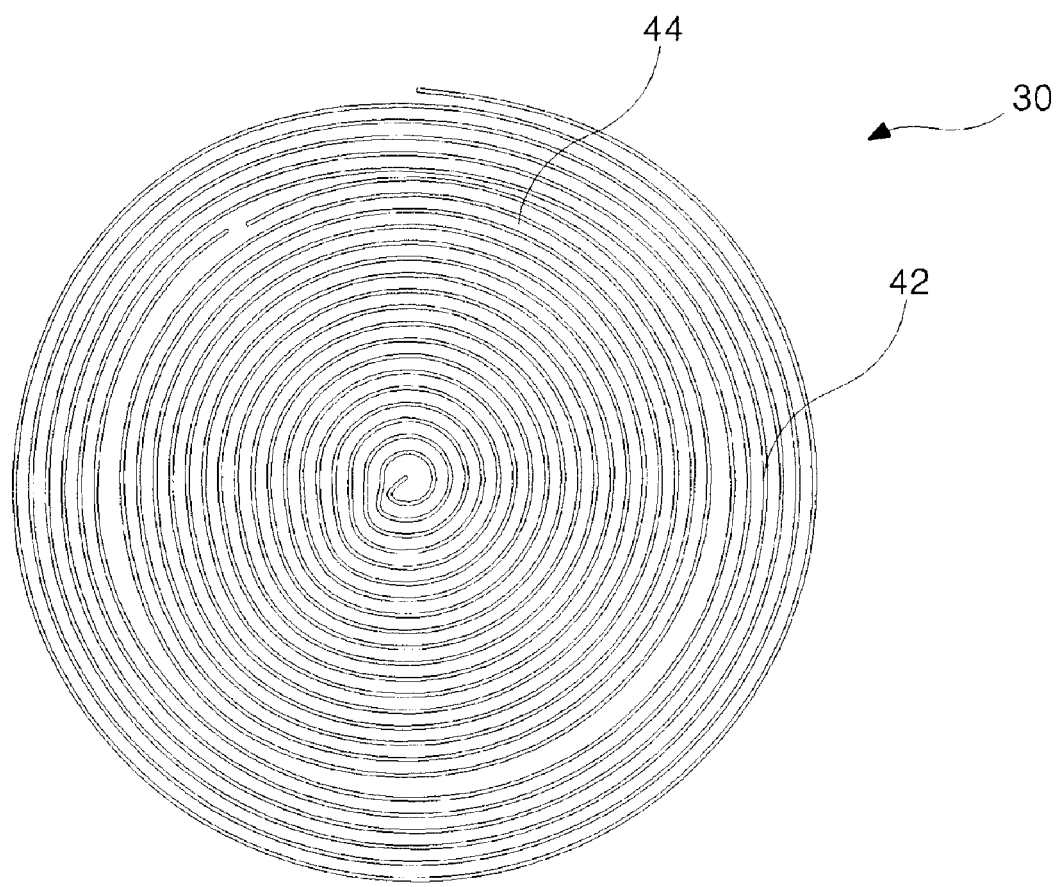
FIG. 3 is a plan view of a heater in an electrostatic chuck according to the related art.
Figure 4:
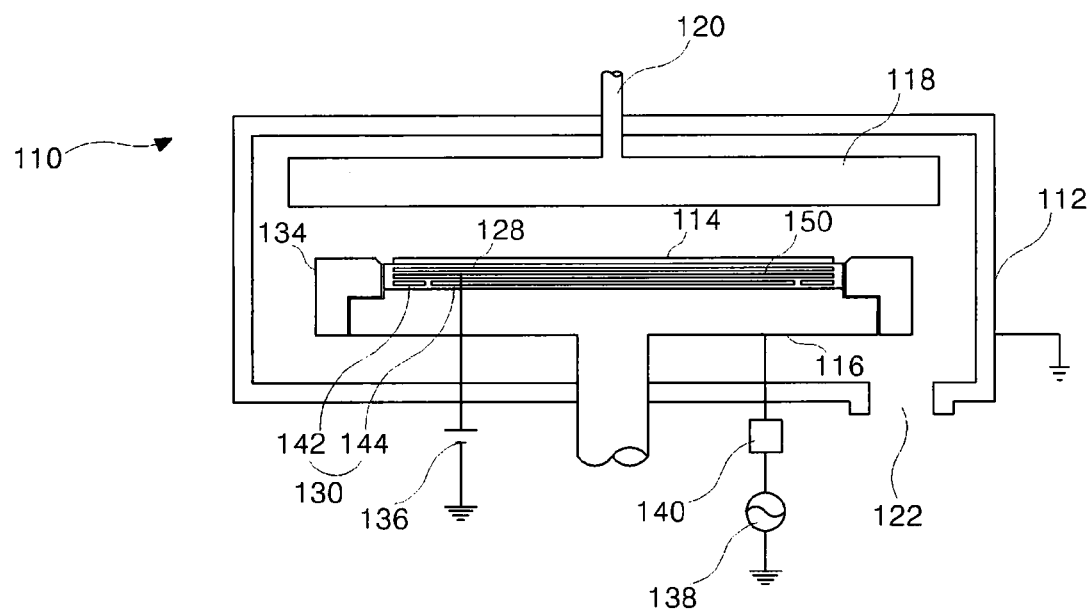
FIG. 4 is a schematic cross-sectional view of an apparatus for treating a substrate including an electrostatic chuck according to the present invention.
Figure 5:
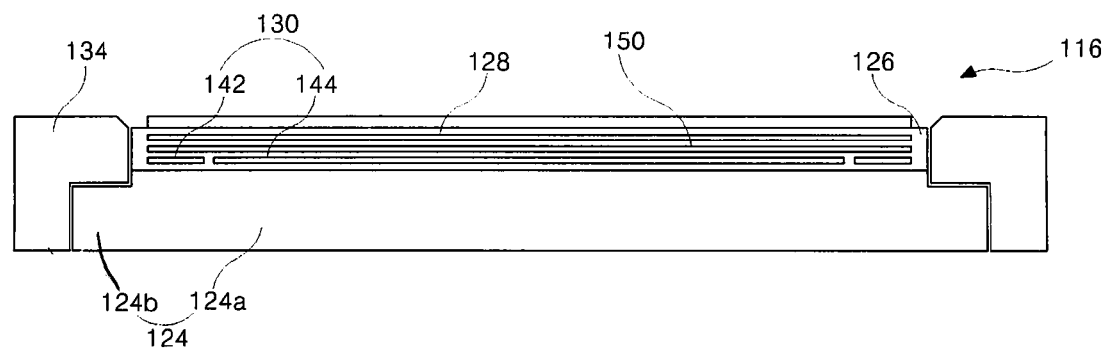
FIG. 5 a cross-sectional view of an electrostatic chuck according to the present invention.
Figure 6:
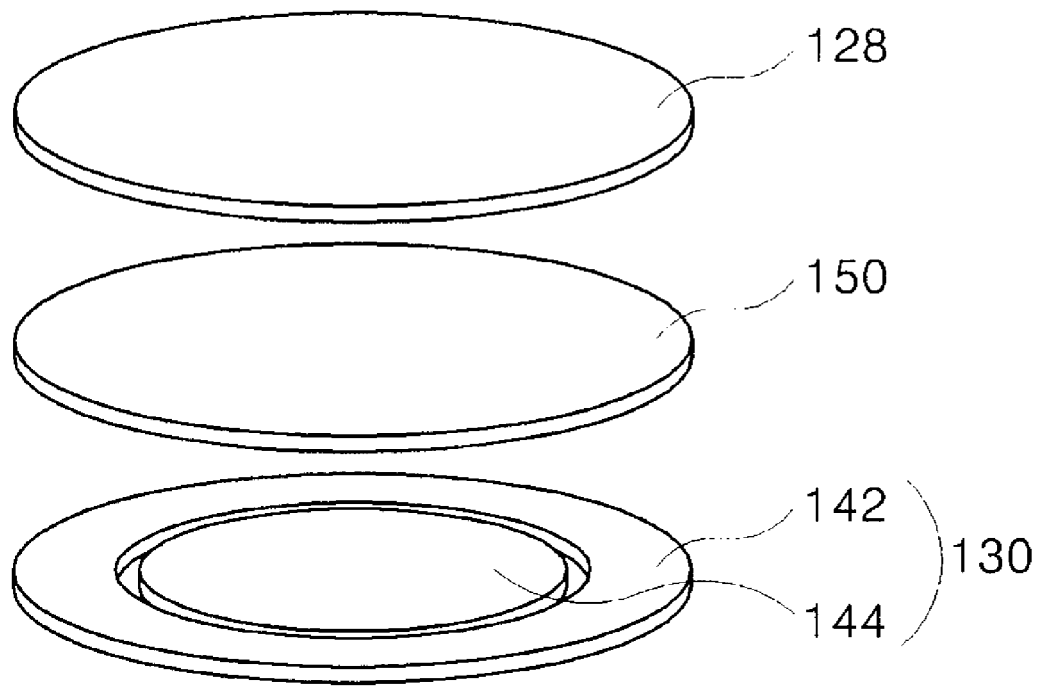
FIG. 6 is an exploded perspective view of an electrostatic chuck according to the present invention.

FIG. 4 is a schematic cross-sectional view of an apparatus for treating a substrate including an electrostatic chuck according to the present invention, and FIG. 5 a cross-sectional view of an electrostatic chuck according to the present invention. FIG. 6 is an exploded perspective view of an electrostatic chuck according to the present invention.

In FIGS. 4 to 6, the apparatus 110 includes a chamber 112 having a reaction chamber, an electrostatic chuck 116 disposed in the chamber 112, a gas distribution plate 118 over the electrostatic chuck 116, a gas providing pipe 120 providing a reaction gas into the gas distribution plate 118 and an exhaust pipe 122 through which the reaction gas and particles in the chamber 112 are exhausted.

The electrostatic chuck 116 includes a body 124 of an aluminum-based material, an insulating plate 126 combined with and disposed on the body 124, a direct current electrode 128, a heater 130 under the direct current electrode 128 and a thermal conduction plate 150 disposed between the direct current electrode 128 and the heater 130. The direct current electrode 128, the heater 130 and the thermal conduction plate 150 are disposed in the insulating plate 126. The insulating plate 126 is formed of a ceramic-based material and attached onto a top surface of the body 124. The body 124 includes a center portion 124a and an edge portion 124b having a thickness smaller than the center portion 124a such that the body 124 has a step difference. The edge portion 124b of the body 124 is combined with a focus ring 134. The focus ring 134 is formed of a ceramic-based material. A plasma region is expanded into an outer region of the substrate 114 due to the pocus ring 134 such that uniform plasma is deposited onto the substrate 114. Instead of the heater 130, a first path (not shown) through which a heating material for heating the substrate 114 flows may be formed. A second path (not shown) through which a refrigerant material for cooling the substrate 114 may be further formed. One of the heater 130 and the first path and the second path may be referred to as a temperature controlling unit.

The substrate 114 is disposed on the insulating plate 126 of the electrostatic chuck 116. The direct current electrode 128 of a tungsten-base material is connected to a direct current source 136 such that an electrostatic power is generated. The substrate 114 is stably fixed on the electrostatic chuck 116 by the electrostatic power. A radio frequency (RF) power source 138 is connected to the body 124 of the electrostatic chuck 116, and the chamber 112 is connected to a ground. As a result, the body 124 of the electrostatic chuck 116 is electrically insulated from the chamber 112. A matcher 140 matching impedances for providing a maximum power is disposed between the RF power source 138 and the body 124 of the electrostatic chuck 116.

Referring to FIG. 7, the heater 130 having a coil shape is disposed in the electrostatic chuck 116. The heater 130 includes an outer heater 142 and an inner heater 144. Namely, the inner heater 144 is disposed inside of the outer heater 142. When a thin film is deposited onto the substrate 114 or a thin film on the substrate 114 is etched, the substrate 114 is heated into a process temperature by the heater 130.

Since the insulating plate 126 is formed of a ceramic-based material having a relatively low thermal conductivity and each of the outer and inner heaters 142 and 144 has a coil shape, there may be a temperature deviation in a top surface of the insulating plate 126. The temperature deviation may be generated between the coils. However, in the present invention, in order to uniformly diffuse a heat from the outer and inner heaters 142 and 144, the thermal conduction plate 150 is disposed between each of the outer and inner heaters 142 and 144 and the direct current electrode 128. The thermal conduction plate 150 includes a material having a high thermal conductivity and a low thermal expansion rate. The material of the thermal conduction plate 150 may includes a metallic material or a metal alloy. For example, the material of the thermal conduction plate 150 includes one of aluminum, tungsten, nickel, aluminum alloy, tungsten alloy and nickel alloy.

The thermal conduction plate 150 is a thin plate having a thickness of about 0.01 mm to about 0.5 mm. The thermal conduction plate 150 is space apart from the direct current electrode 128 by a distance of about 0.5 mm. The thermal conduction plate 150 is completely covered with the ceramic-based material of the insulating plate 126 such that the thermal conduction plate 150 is electrically insulated from the direct current electrode 128. The thermal conduction plate 150 has a plate shape to improve a thermal conduction property. However, the thermal conduction plate 150 may have a mesh shape depending on requirements. The substrate 114 is uniformly and quickly heated or cooled by the thermal conduction plate 150.

The apparatus 110 including the above-mentioned electrostatic chuck 116 is driven as followings. First, the substrate 114 is transported into the chamber 112 through a door (not shown) and disposed onto the insulating plate 126 of the electrostatic chuck 116. Then, the substrate 114 is stably fixed onto the insulating plate 126 by an electrostatic power generated by the direct current electrode 128. Gases in the reaction space of the chamber 112 are exhausted such that the reaction space of the chamber 112 has a vacuum state. A reaction gas is sprayed over the substrate 114 through the gas distribution plate 118, and an RF power is applied into the electrostatic chuck 116 by the RF power source 140 at the same time. An RF electric field is generated between the electrostatic chuck 116 and the chamber 112 by the RF power applied into the electrostatic chuck 116. An accelerated electron by the RF electric field is collided with a neutral gas such that a plasma including an ion and a radical is generated. As a result, a thin film is deposited onto the substrate 114 or a thin film on the substrate 114 is etched.

As mentioned above, the substrate 114 is heated into a process temperature by the heater 130 in the body 124 of the electrostatic chuck 116. The outer and inner heaters 142 and 144 are independently driven such that a temperature in the center portion of the electrostatic chuck 116 and a temperature in the edge portion of the electrostatic chuck 116 can be independently controlled. A heat from the heater 130 is uniformly diffused due to the thermal conduction plate 150 adjacent to the heater 130 such that the substrate 114 on the insulating plate 126 is uniformly heated. As a result, there are improved properties in a thin film deposition process and a thin film etching process such that the productions has an improved quality.

It will be apparent to those skilled in the art that various modifications and variations can be made in the apparatus having a high gas conductance without departing from the spirit or scope of the invention. Thus, it is intended that the present invention covers the modifications and variations of this invention provided they come within the scope of the appended claims and their equivalents.

What is claimed is:

1. An electrostatic chuck for an apparatus for treating a substrate, comprising:
    a body;
    an insulating plate attached onto a top surface of the body, wherein the substrate is disposed on the insulating plate;
    an electrode connected to a direct current source to generate an electrostatic power;
    a temperature controlling unit including a heating unit under the electrode; and
    a thermal conduction unit disposed between the electrode and the temperature controlling unit, wherein a heat generated from the temperature controlling unit is uniformly diffused to a surface of the insulating plate by the thermal conduction unit, and wherein the electrode, the temperature controlling unit and the thermal conduction unit are spaced apart from each other and enclosed within the insulating plate, wherein an width of the thermal conduction unit is substantially equal to an width of the electrode.

2. The electrostatic chuck according to claim 1, wherein the thermal conduction unit is formed of a metallic material or a metal alloy.

3. The electrostatic chuck according to claim 1, wherein the thermal conduction unit is formed of one of aluminum, tungsten, nickel, aluminum alloy, tungsten alloy and nickel alloy.

4. The electrostatic chuck according to claim 1, wherein the thermal conduction unit has a thickness of about 0.01 mm to about 0.5 mm.

5. The electrostatic chuck according to claim 1, wherein the heating unit includes a heater.

6. The electrostatic chuck according to claim 1, wherein the body is formed of an aluminum-base material and the insulating plate is formed of a ceramic-based material.

7. The electrostatic chuck according to claim 1, wherein the thermal conduction unit is electrically insulated from the electrode.

8. The electrostatic chuck according to claim 1, wherein the thermal conduction unit has one of a plate shape and a mesh shape.

9. An apparatus for treating a substrate, comprising:
    a chamber having a reaction space;
    an electrostatic chuck, on which the substrate is disposed, positioned in the reaction space, the electrostatic chuck comprising:
        a body;
        an insulating plate attached onto a top surface of the body, wherein the substrate is disposed on the insulating plate;
        an electrode connected to a direct current source to generate an electrostatic power;
        a temperature controlling unit including a heating unit under the electrode; and
        a thermal conduction unit disposed between the electrode and the temperature controlling unit, wherein a heat generated from the temperature controlling unit is uniformly diffused to a surface of the insulating plate by the thermal conduction unit, and wherein the electrode, the temperature controlling unit and the thermal conduction unit are spaced apart from each other and enclosed within the insulating plate; and
    a gas distribution plate over the electrostatic chuck, wherein an width of the thermal conduction unit is substantially equal to an width of the electrode.

10. The electrostatic chuck according to claim 9, wherein the thermal conduction unit is formed of a metallic material or a metal alloy.

11. The electrostatic chuck according to claim 10, wherein the thermal conduction unit is formed of one of aluminum, tungsten, nickel, aluminum alloy, tungsten alloy and nickel alloy.

12. The electrostatic chuck according to claim 9, wherein the thermal conduction unit has a thickness of about 0.01 mm to about 0.5 mm.

13. The electrostatic chuck according to claim 9, wherein the heating unit includes a heater.

14. The electrostatic chuck according to claim 9, wherein the body is formed of an aluminum-base material and the insulating plate is formed of a ceramic-based material.

15. The electrostatic chuck according to claim 9, wherein the thermal conduction unit is electrically insulated from the electrode.

16. The electrostatic chuck according to claim 9, wherein the thermal conduction unit has one of a plate shape and a mesh shape.

* * * * *